(12) United States Patent
Veeder

(10) Patent No.: US 8,288,702 B2
(45) Date of Patent: *Oct. 16, 2012

(54) RESPONSE-ENHANCED MONOLITHIC-HYBRID PIXEL

(75) Inventor: Kenton Veeder, Santa Barbara, CA (US)

(73) Assignee: SiOnyx, Inc., Beverly, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/112,645

(22) Filed: May 20, 2011

(65) Prior Publication Data

US 2011/0272583 A1 Nov. 10, 2011

Related U.S. Application Data

(63) Continuation of application No. 12/235,060, filed on Sep. 22, 2008, now Pat. No. 7,968,834.

(51) Int. Cl.
*H01L 27/00* (2006.01)
*H01L 31/00* (2006.01)

(52) U.S. Cl. .............. 250/208.1; 250/339.05; 257/440

(58) Field of Classification Search .......... 250/208.1, 250/339.02, 339.05, 370.08; 348/308, 162, 348/164, 166; 257/440, 461

See application file for complete search history.

(56) References Cited

U.S. PATENT DOCUMENTS

| | | | |
|---|---|---|---|
| 4,201,450 A | 5/1980 | Trapani | |
| 4,277,793 A | 7/1981 | Webb | |
| 4,965,784 A | 10/1990 | Land et al. | |
| 5,523,570 A | 6/1996 | Hairston | |
| 5,751,005 A | 5/1998 | Wyles et al. | |
| 5,773,820 A | 6/1998 | Osajda et al. | |
| 6,111,300 A | 8/2000 | Cao et al. | |
| 6,867,806 B1 | 3/2005 | Lee et al. | |
| 7,057,256 B2 | 6/2006 | Carey, III et al. | |
| 7,354,792 B2 | 4/2008 | Carey, III et al. | |
| 7,390,689 B2 | 6/2008 | Mazur et al. | |
| 7,442,629 B2 | 10/2008 | Mazur et al. | |
| 7,968,834 B2 * | 6/2011 | Veeder | 250/208.1 |
| 2006/0181627 A1 | 8/2006 | Farrier | |
| 2006/0231914 A1 | 10/2006 | Carey et al. | |
| 2007/0051876 A1 | 3/2007 | Sumi et al. | |
| 2008/0258604 A1 | 10/2008 | Mazur et al. | |

(Continued)

FOREIGN PATENT DOCUMENTS

WO 2008091242 A2 7/2008

OTHER PUBLICATIONS

Carey, et al., "Fabrication of Micrometer-Sized Conical Field Emitters Using Femtosecond Laser-Assisted Etching of Silicon," Proc. IVMC 2001, 75-76, UC Davis, Davis, CA.

(Continued)

*Primary Examiner* — John Lee
(74) *Attorney, Agent, or Firm* — Thorpe North & Western LLP

(57) ABSTRACT

A light-sensing pixel for detecting at least a portion of the electromagnetic spectrum includes a first detector element having a micro-structured surface for detecting an infrared range of wavelengths of the electromagnetic spectrum. The light-sensing pixel further includes a second detector element for detecting a second range of wavelengths of the electromagnetic spectrum, wherein the second range of wavelengths is shorter than the first range of wavelengths and the first and second detector element are formed monolithically on a silicon substrate.

19 Claims, 3 Drawing Sheets

U.S. PATENT DOCUMENTS

| | | |
|---|---|---|
| 2009/0039397 A1 | 2/2009 | Chao |
| 2009/0057536 A1 | 3/2009 | Hirose |
| 2009/0095887 A1 | 4/2009 | Saveliev |
| 2009/0218493 A1 | 9/2009 | McCaffrey et al. |
| 2010/0044552 A1 | 2/2010 | Chen |
| 2010/0051809 A1 | 3/2010 | Onat et al. |
| 2010/0072349 A1 | 3/2010 | Veeder |

OTHER PUBLICATIONS

Carey, et al., "Field Emission from Silicon. Microstructures Formed by Femtosecond Laser Assisted Etching," Proc. CLEO 2001 (Baltimore, MD 2001) 555-557.

Carey, et al. "Femtosecond Laser-Assisted Microstructuring of Silicon for Novel Detector, Sensing and Display Technologies", LEOS 2002, 97-98, Glasgow, Scotland.

Carey, et al., "High Sensitivity Silicon-Based VIS/NIR Photodetectors", Optical Society of America (2003) 1-2.

Carey, et al. "Femtosecond Laser-Assisted Microstructuring of Silicon for Novel Detector, Sensing and Display Technologies", LEOS 2003, 481-482, Tuscon, AR.

Carey et al., "Femtosecond-Laser-Assisted Microstructuring of Silicon Surfaces", Optics and Photonics News, 2003. 14, 32-36.

Chien et al, "Pulse Width Effect in Ultrafast Laser Processing of Materials," Applied Physics A, 2005, 1257-1263, 81, Springer Berlin, Heidelberg, Germany.

Crouch et al., "Infrared Absorption by Sulfur-Doped Silicon Formed by Femtosecond Laser Irradiation", Appl. Phys. A, 2004, 79, 1635-1641.

Crouch et al., "Comparison of Structure and Properties of Femtosecond and Nanosecond Laser-Structured Silicon" Appl. Phys. Lett., 2004, 84,1850-1852.

Dolgaev et al., "Formation of Conical Microstructures Upon Laser Evaporation of Solids", Appl. Phys. A, 2001, 73, 177-181.

Fowlkes et al., "Surface Microstructuring and Long-Range Ordering of Silicon Nanoparticles", Appl. Phys. Lett., 2002, 80 (20), 3799-3801.

Her et al., "Novel Conical Microstructures Created in Silicon With Femtosecond Laser Pulses", CLEO 1998, 511-512, San Francisco, CA.

Her et al., "Microstructuring of Silicon with Femtosecond Laser Pulses," Applied Physics Letters, 1998, 1673-1675, vol. 73, No. 12, American Institute of Physics.

Her, et al., "Femtosecond laser-induced formation of spikes on silicon," Applied Physics A, 2000, 70, 383-385.

Hu et al., "Solar Cells from Basic to Advanced Systems," McGraw Hill Book Co., 1983, 39, New York, New York.

Nayak et al, "Semiconductor Laser Crystallization of a-Si:H," SPIE Digital Library, 2003, 277-380, vol. 4977, Bellingham, Washington.

Nayak et al, "Semiconductor Laser Crystallization of a-Si:H on Conducting Tin-Oxide-Coated Glass for Solar Cell and Display Applications," Applied Physics A, 2005, 1077-1080, 80, Springer Berlin, Heidelberg, Germany.

Nayak et al, "Ultrafast-Laser-Assisted Chemical Restructuring of Silicon and Germanium Surfaces," Applied Surface Science, 2007, 6580-6583, vol. 253, Issue 15, Elsevier B.V.

Nayak et al, "Ultrafast Laser Textured Silicon Solar Cells," Mater. Res. Soc. Symp. Proc., 2009, vol. 1123, Materials Research Society.

Pedraza et al., "Surface Nanostructuring of Silicon", Appl. Phys. A, 2003, 77, 277-284.

Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.

Sanchez et al., "Dynamics of the Hydrodynamical Growth of Columns on Silicon Exposed to ArF Excimer-Laser Irradiation", Appl. Phys. A, 1998, 66, 83-86.

Sanchez et al., "Whiskerlike Structure Growth on Silicon Exposed to ArF Excimer Laser Irradiation", Appl. Phys. Lett., 1996, 69 (5), 620-622.

Serpengüzel et al., "Temperature Dependence of Photluminescence in Non-Crystalline Silicon", Photonics West (San Jose, CA, 2004) 454-462.

Shen et al., "Formation of Regular Arrays of Silicon Micorspikes by Femotsecond Laser Irradiation Through a Mask", Appl. Phys. Lett., 82, 1715-1717 (2003).

Solar Energy Research Institute, "Basic Photovoltaic Principles and Methods," Van Nostrand Reinhold Co., NY 1984, pp. 45-47 and 138-142.

Wu et al., "Black Silicon: A New Light Absorber," APS Centennial Meeting (Mar. 23, 1999).

Wu et al., "Femtosecond laser-gas-solid interactions," Thesis presented to the Department of Physics at Harvard University, pp. 1-113, 126-136, Aug. 2000.

Wu et al., "Visible Luminescence From Silicon Surfaces Microstructured in Air". Appl. Phys. Lett., vol. 81, No. 11, 1999-2001 (2002).

Younkin, "Surface Studies and Microstructure Fabrication Using Femtosecond Laser Pulses," Thesis presented to the Division of Engineering & Applied sciences at Harvard University (Aug. 2001).

Younkin et al., "Infrared Absorption by Conical Silicon Microstructures Made in a Variety of Background Gases Using Femtosecond-Laser Pulses", J. Appl. Phys., 93, 2626-2629 (2003).

Zhang et al, "Ultra-Shallow P+-Junction Formation in Silicon by Excimer Laser Doping: a Heat and Mass Transfer Perspective," Int. J. Heat Mass Transfer, 1996, 3835-3844, vol. 39, No. 18, Elsevier Science Ltd., Great Britain.

International Search Report and Written Opinion of the International Searching Authority, Apr. 16, 2009, from parent counterpart foreign application PCT/US08/77209, International filed Sep. 22, 2008.

International Preliminary Report on Patentability and Written Opinion of the International Searching Authority, Mar. 31, 2011, from parent counterpart foreign application PCT/US08/77209, International filing date Sep. 22, 2008.

\* cited by examiner

RESPONSE-ENHANCED MONOLITHIC-HYBRID PIXEL

RELATED APPLICATIONS

This application is a continuation of U.S. patent application Ser. No. 12/235,060, entitled "Response-Enhanced Monolithic-Hybrid Pixel," filed on Sep. 22, 2008, now U.S. Pat. No. 7,968,834 which is hereby incorporated by reference.

TECHNICAL FIELD

The present disclosure relates to the detection of electromagnetic radiation, and more particularly, to methods and articles for detecting such radiation using monolithic or hybrid semiconductor-based designs that have improved response to incident radiation.

GOVERNMENT FUNDING

N/A

BACKGROUND

Pixels, or "picture elements," are the basic light- or color-detection and display elements that form a digital image. Typical digital video and imaging systems use a collection of detector pixels to capture a two-dimensional image field at a capture end (such as a camera) and another corresponding collection of display pixels to display the corresponding two-dimensional image at a display end (such as a monitor). In digital imaging systems, an array of light-sensitive pixels, each including a light sensor or detector, respond to an intensity of incident light at each pixel location, providing an electrical output representative of the incident light. The output of an imager can be referred to as an image.

Motion or video cameras repeat the process described above, but permit a time-sequence to be captured, for example at regular intervals, so that the captured images can be replayed to recreate a dynamic scene or sequence.

Most film and digital pixel imagers include wavelength-specific sensors or detectors. The chemical composition of the film or the design of the digital pixels and associated filters determines the range of wavelengths of light to which the film or pixels respond. Practically, a detector or imager has a frequency response that is optimized to provide images of light in the range of wavelengths the imager is designed for. The most common examples are sensitive to visible light (e.g., red, green, blue, and combinations thereof). Visible light corresponds to the range of wavelengths of electromagnetic radiation to which our eyes are sensitive, and is generally in the range of 400 to 750 nanometers (nm).

Special film and digital pixel imagers are designed for low-light operation to provide night vision capability for military, security, or other special applications in which an illumination source is not available to cause a visible light image. Low-light or night vision imagers rely on detecting and imaging frequencies below (wavelengths longer than) the visible (red) wavelengths, and are sometimes called infra-red (IR) detectors. IR detection is more suited for picking up heat emissions from objects such as a person's body or a vehicle. IR radiation itself can be roughly divided into sub-spectra including the near-infra-red (NIR) having wavelengths between about 750 to 1100 nm, short-wave-infra-red (SWIR) having wavelengths between about 1100 and 2500 nm, medium-wave-infra-red (MWIR) having wavelengths between about 2500 and 8000 nm, and long-wave-infra-red (LWIR) having wavelengths between about 8000 and 12000 nm. These ranges are defined somewhat arbitrarily, and are given merely for simplifying the following discussion, and those skilled in the art will appreciate the generality of the discussion as it relates to the bands of wavelengths of the electromagnetic spectrum.

Present visible light imaging cameras have used silicon devices made with CID, CCD, or CMOS APS architectures. The low cost and efficient collection of photons from 400-750 nm wavelengths has enabled silicon devices. Extending the use of silicon imagers into the near infrared (NIR) band requires a greater volume of material to detect these wavelengths because of silicon's relatively low absorption coefficient in this wavelength range. This increases the size of the detectors and causes increased leakage current and requires expensive manufacturing processes or higher voltages to operate. The use of thick silicon substrates also limits the ability to integrate other devices.

Present low-light- or night vision IR imagers are usually less sensitive than would be desired, lack color definition, and have limited frequency response. Also, low-light imagers can be more costly, noisy, and require greater circuit resources than visible light imagers to achieve useful gains in low-signal conditions. Furthermore, IR sensors are larger than would be desired for compact portable applications because most IR sensitive materials must be cooled significantly to achieve good performance. Most sensors that can detect long-wavelength portions of the electromagnetic spectrum remain poor at detecting visible light, especially in the short-wavelength portions of the spectrum, for example blue and violet light.

One presently-available solution is a stacked detector, as described for example in U.S. Pat. No. 6,111,300 to Cao, et al. However, this detector fails to adequately capture radiation in a range suitable for some applications with sufficient sensitivity. In addition, present systems do not generally provide for efficient cost and space-efficient readout circuitry for use with stacked detector elements. Also, such systems lack the flexibility in their design to selectively optimize the detectors for a variety of uses under corresponding conditions.

In summary, present imaging sensors and pixels do not sufficiently capture the full range of wavelengths useful for developing good images across long and short wavelength portions of the spectrum, and improved detector designs and readout circuit integration is needed for such detectors.

SUMMARY

From the discussion given above it can be appreciated that better detectors capable of operating in a variety of wavelength ranges are desirable. The following discussion provides such improved detection methods and apparatus, including methods and apparatus for detecting light in the IR ranges as well as shorter visible ranges, including in the blue range. Greater bandwidth detectors allow imaging in a variety of lighting conditions, for example in day and night. Embodiments hereof provide silicon-based imagers and detector elements capable of imaging across a range of electromagnetic wavelengths, including in various portions of the IR spectrum and in a wide range of lighting conditions. Additionally, the present embodiments provide compact, thin designs that offer increased sensitivity and resolution at a lower cost than presently available systems. Embodiments hereof provide improved manufacturing and process handling capability for producing the detectors and for implementing readout circuits associated therewith.

A specific embodiment hereof is directed to a light-sensing pixel for detecting at least a portion of the electromagnetic spectrum, including a first detector element having a laser-treated detector portion for detecting a first range of wavelengths of the electromagnetic spectrum; a second detector element for detecting a second range of wavelengths of the electromagnetic spectrum; a collection point for accumulating a first electrical output of said first detector element as well as a second electrical output of said second detector; a bias point for applying a biasing voltage to said first detector element and capable of affecting the first electrical output of said first detector element; and an output point for providing an electrical output of said light-sensing pixel.

Another embodiment hereof is directed to a light-sensitive array comprising a plurality of pixels as described above, wherein said plurality of pixels each provides an electrical output that can be addressably sensed and contributes to a collective output of said array.

Yet another embodiment is directed to an imaging apparatus comprising an array of pixels as described above such that an image corresponding to said collective output of said array or pixels can be captured or displayed.

Other embodiments and uses for the methods and systems given herein can be developed by those skilled in the art upon comprehending the present disclosure.

BRIEF DESCRIPTION OF THE DRAWINGS

For a fuller understanding of the nature and advantages of the present invention, reference is be made to the following detailed description of preferred embodiments and in connection with the accompanying drawings, in which.

DETAILED DESCRIPTION

Figure 1:
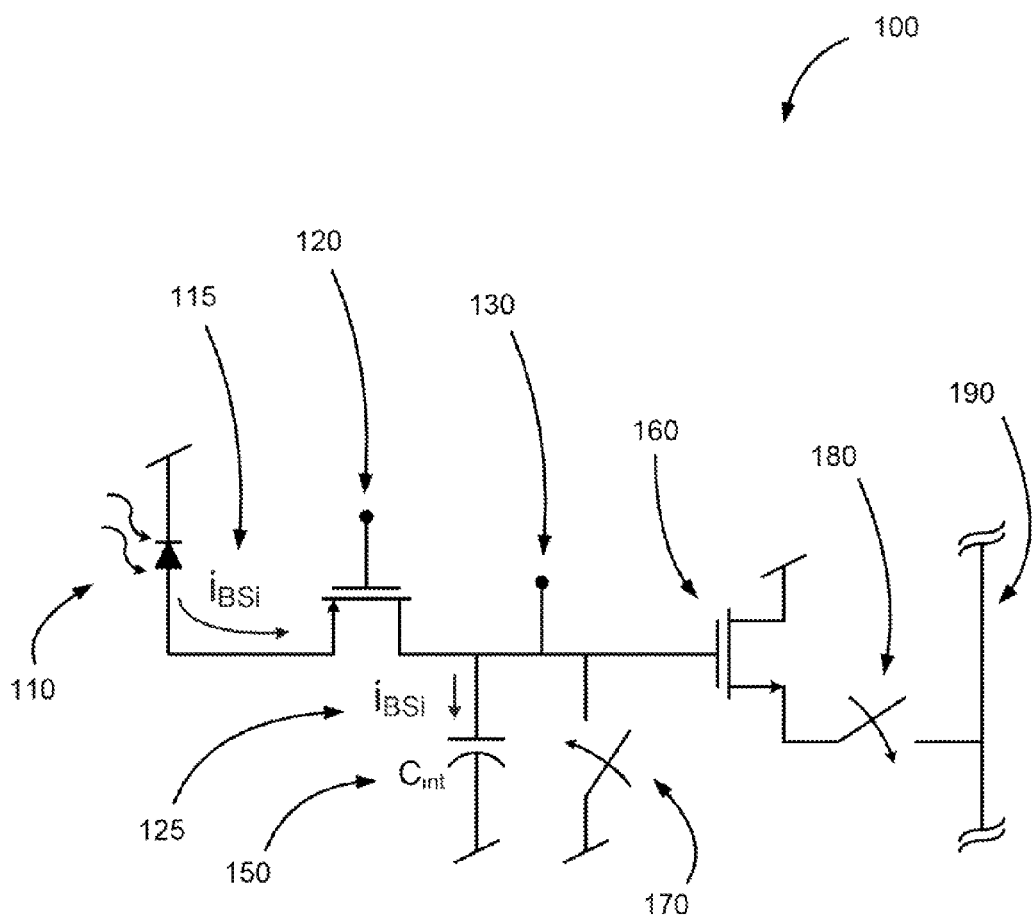
FIG. 1 illustrates an exemplary light-sensing pixel including a black silicon detector element.

The present disclosure describes systems and articles of manufacture for providing light sensors, pixels, detectors, or imagers and methods for making and using the same. These methods and apparatus are useful in many applications, including applications benefiting from imaging in a variety of light conditions. In some embodiments the detectors and techniques provided herein can be adapted to small, inexpensive, low-power, portable applications such as hand-carried, helmet-mounted and similar applications.

Some or all embodiments hereof include a sensor or detector sensitive to certain electromagnetic wavelengths and formed into a device on a semiconductor substrate. In some embodiments, the detector includes a portion comprising a semiconductor material, for example silicon, which is irradiated by a short pulse laser to create modified micro-structured surface morphology. The laser processing can be the same or similar to that described in U.S. Pat. No. 7,057,256 to Carey et al., which is hereby incorporated by reference. The laser-processed semiconductor is made to have advantageous light-absorbing properties. In some cases this type of material has been called "black silicon" due to its visually darkened appearance after the laser processing and because of its enhanced absorption of light and IR radiation compared to other forms of silicon.

Generally, the wavelength of the irradiating laser pulse for making black silicon, its fluence, and pulsewidth can affect the morphology of the microstructured surface. In some embodiments, the laser fluence may be between about 1.5 kJ/m$^2$ and 12 kJ/m$^2$, but can vary depending on the substrate composition. The choice of the fluence of laser pulses irradiating a silicon wafer to generate a microstructured layer therein can also affect the gettering performance (capacity and/or specificity) of a microstructured substrate. In general, in various embodiments of the invention, the laser pulse fluence is selected to be greater than about 3 kJ/m$^2$. More preferably, the fluence may be chosen to be in a range of about 3 kJ/m$^2$ to about 10 kJ/m$^2$, or a range of about 3 kJ/m$^2$ to about 8 kJ/m$^2$.

Additionally, the laser pulse length can affect the morphology and absorption properties of the treated silicon. Irradiation of a substrate according to the invention can be with femtosecond laser pulses or picosecond or nanosecond pulses. Other factors that can affect microstructures morphology include laser polarization and laser propagation direction relative to the irradiated silicon surface.

In some embodiments, the laser microstructuring of a substrate is performed in the presence of a mixture of two or more substances where needed to accomplish the present purposes. For example, silicon samples treated in the presence of a mixture of $SF_6$ and $Cl_2$ exhibit an increase in the microstructure density at higher partial pressure of $SF_2$.

We now turn to a description of an exemplary apparatus for detecting electromagnetic radiation or light in at least a range of wavelengths of the electromagnetic spectrum.

FIG. 1 illustrates an exemplary pixel 100 comprising a photonic detector 110 of the laser-treated type described above (sometimes referred to as 'black silicon' detector) which can be integrated into a same substrate as the readout circuitry for the pixel. Radiation in certain wavelength ranges incident on pixel 100 is detected by detector 110 and creates a corresponding current $i_{BSi}$ 115, which represents an electrical output, to flow from the detector. A direct injection detector bias 120 is applied to hold a relatively constant voltage across the detector 110.

Integration capacitance $C_{int}$, 150 which may be physical or parasitic and represents a collection point, integrates the charge collected by flow of current $i_{BSi}$ 125 through the capacitor 150 over some time. Note that in this embodiment, currents 125 and 115 are equivalent and integrate on $C_{int}$, 150. A resultant output voltage is provided at the input of signal buffer 160, which represents an output point. Contact post 130 in this exemplary embodiment is not used but may be exposed at the surface of pixel 100, and can be used as will be described below to couple to a hybridized detector element to enhance the response of a pixel. Signal buffer 160 is addressed by column 190 and row enable switch 180 for non-destructive reading of pixel 100. It should be appreciated that a source follower buffer, row switch, and column line are merely examples of a generally-realizable output port, which here includes circuit elements 160, 190, and 180 only by way of example. A reset switch 170 shorts out capacitor 150 thus resetting the collection process. During normal operation detector 110 is reverse biased by the bias voltage applied to terminal 120 as mentioned above.

In some applications, the pixel 100 and its laser-treated detector 110 allow for detection and sensitivity to long wavelength radiation including in ranges beyond the visible range of the electromagnetic spectrum, such as the near infra-red or the infra-red ranges.

Figure 2:
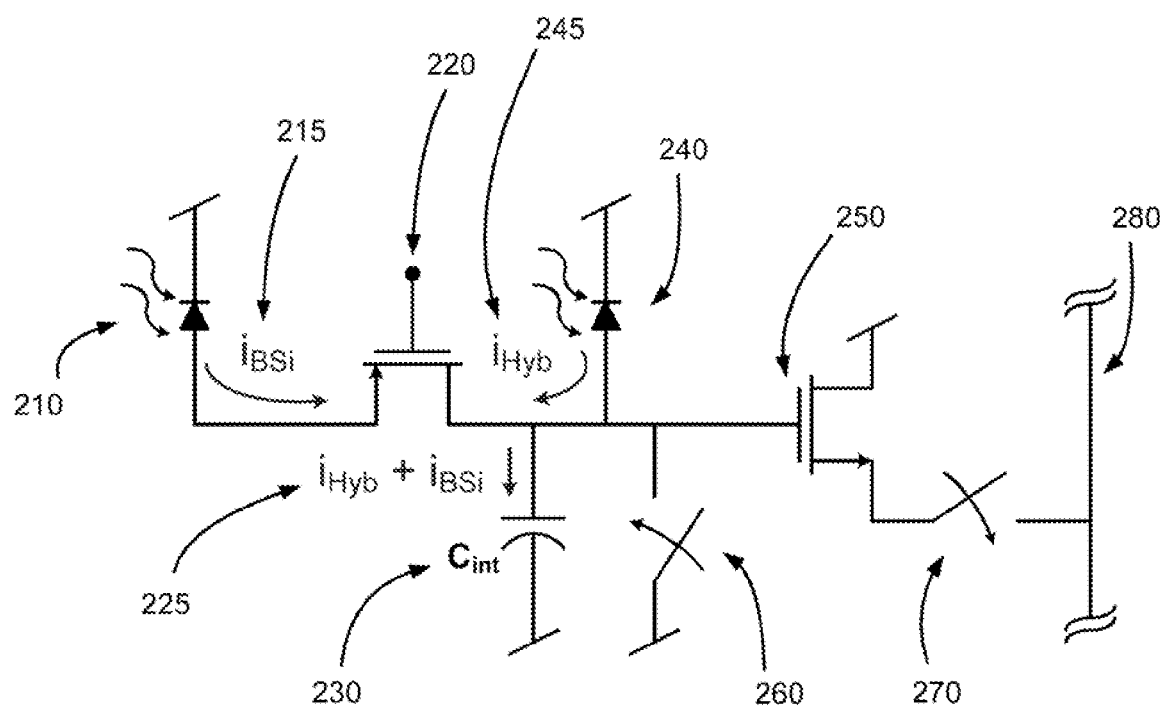
FIG. 2 illustrates an exemplary light-sensing pixel including both a black silicon detector element and another detector element which can be hybridized onto the pixel for enhanced response.

FIG. 2 illustrates an exemplary response-enhanced pixel 200 having both a first laser-treated detector element 210 similar to those described above, but also includes another light sensitive detector element 240. Second detector 240 may be sensitive to a range of the electromagnetic spectrum that is different from the range of wavelengths that first detector 210 is sensitive to. For example, second detector 240 may be sensitive to shorter wavelengths than first detector 210. More specifically, second detector 240 may be sensitive to wavelengths nearer the blue light or ultraviolet (short) wavelengths of the visible spectrum. As will be described below, this can allow for an overall pixel 200 that has sensitivity to a broad range of wavelengths ranging across those detected by first detector 210 (e.g. longer wavelengths) to those detected by second detector 240 (e.g. shorter wavelengths).

In this embodiment, a first current or electrical output $i_{BSi}$ 215 from first detector 210 as well as a second current or electrical output $i_{Hyb}$ 245 from second detector 240 are summed and cause an integrated collected charge on collection point or capacitor $C_{int}$ 230 to develop an output voltage at output point or signal buffer 250.

The pixel 200 can be addressed and read on column 280 and row enable 270 and can contribute to an array of pixels 200 in an imaging product as discussed earlier. Again, a reset switch 260 can be provided to zero out or reset or short out integration capacitor $C_{int}$ 230. As discussed earlier, an generic output port can be used in the present context, of which the present embodiment includes circuit elements 250, 270, and 280 only by way of example.

In manufacturing such enhanced response detector pixels 200, the second detector element 240 may be hybridized over a monolithic pixel array using the previously-unused post 130 of FIG. 1. The second detector 240 can be selected and constructed such that it provides a great enough output resistance to the circuit of FIG. 2 so that a change in voltage on capacitor $C_{int}$ 230 not to substantially affect the generated photocurrent $i_{Hyb}$ 245 of second detector 240.

The combination of the detected light and corresponding outputs of detectors 210 and 240 can be used to form enhanced response pixels and enhanced response imaging products having a plurality of pixels such as the exemplary pixel of FIG. 2. Such imaging products can couple a grid of pixels 200 in a two-dimensional format to form sensors such as cameras and scanners that are responsive to a wide range of electromagnetic wavelengths. The output voltage at non-destructive signal buffer 250 will thus correspond to, and in some cases be a function of, the photon flux detected at each detector element, 210, 240.

It should be appreciated that the present disclosure can apply to more than just two detector elements, but rather, three or more detectors could be used, each sensitive to a range of wavelengths in a pixel structure.

In some embodiments, the structure of the present monolithic-hybrid pixels and the low reverse bias voltages required to bias the black silicon detectors allows selective shutting off of the black silicon detectors in situ. That is, the detectors 110 and 210 of FIGS. 1 and 2 may be secured by proper application of bias voltage at terminals 120 and 220, respectively. In the example of the pixel 200 of FIG. 2, this can be used to provide unique and useful integration qualities to pixel 200, and can provide useful discrimination in color detection by pixel 200. The non-destructive read buffer 250 allows varying integration times without destroying or losing the collected charge on integration capacitor $C_{int}$ 230.

In some embodiments the present pixels provide multi-color sensing, multi-integration sensors that enhance the overall response and usefulness of an associated sensing array or imaging product.

Figure 3:
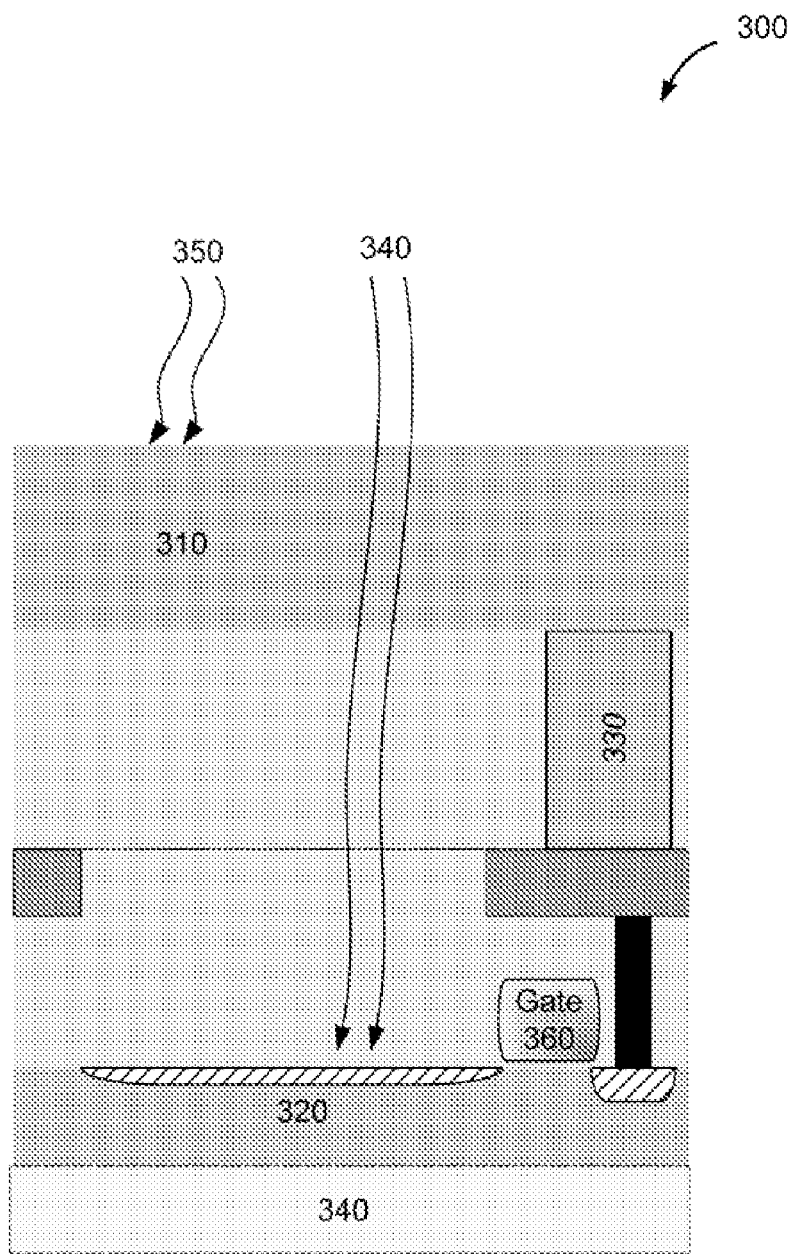
FIG. 3 illustrates an exemplary cross-sectional view of a response-enhanced pixel.

FIG. 3 illustrates a representative cross-sectional view of an exemplary response-enhanced pixel 300 similar to that described earlier with respect to FIG. 2.

Another feature of the present embodiments that facilitates its use in practical applications is that the present laser treated silicon is compatible with most standard CMOS readout circuit substrates, and can leverage known silicon MEMS and amorphous silicon MEMS technologies such as silicon MEMS cantilever technology.

The present invention should not be considered limited to the particular embodiments described above, but rather should be understood to cover all aspects of the invention as fairly set out in the attached claims. Various modifications, equivalent processes, as well as numerous structures to which the present invention may be applicable, will be readily apparent to those skilled in the art to which the present invention is directed upon review of the present disclosure. The claims are intended to cover such modifications.

I claim:

1. A light-sensing imager for detecting at least a portion of the electromagnetic spectrum, comprising:
    a first detector element having a micro-structured surface for detecting a first range of wavelengths of the electromagnetic spectrum, wherein the first range of wavelengths is an infrared range of wavelengths of the electromagnetic spectrum; and
    a second detector element for detecting a second range of wavelengths of the electromagnetic spectrum, wherein the second range of wavelengths is shorter than the first range of wavelengths and the first and second detector element are formed monolithically on a common silicon substrate.

2. The imager of claim 1, wherein the micro-structured surface is formed by laser irradiation.

3. The imager of claim 1, further comprising a collection point for accumulating a first electrical output of the first detector element and a second electrical output of the second detector.

4. The imager of claim 3, wherein the collection point comprises a single collection capacitor constructed and arranged to combine a first current from the first detector and a second current from the second detector to cause an integrated charge on the single collection capacitor.

5. The imager of claim 1, further comprising a bias point for selectively applying a biasing voltage to the first detector element and capable of affecting the first electrical output of the first detector element, wherein the bias point is constructed and arranged to selectively substantially shut off the first electrical output of the first detector element.

6. The imager of claim 5, wherein the bias point is constructed and arranged to selectively apply a reverse bias voltage to selectively shut off the first electrical output of the first detector element.

7. The imager of claim 1, further comprising a single output point for providing and electrical output of the light-sensing imager.

8. The imager of claim 1, wherein the second detector element comprising a semiconducting photodetector element that is sensitive to electromagnetic wavelengths in a visible range of the electromagnetic spectrum.

9. The imager of claim 3, further comprising readout circuitry including addressing switch points for addressing the imager.

10. The imager of claim 9, further comprising a post for coupling the second detector element to the readout circuitry and the collection point.

11. The imager of claim 3, further comprising a reset switch coupled to the collection point.

12. The imager of claim 1, the first and second electrical outputs comprises respective first and second electrical currents, and a bias point comprises a bias voltage terminal electrically coupled to the first and second detector elements and coupled to the collection point so as to control the first and second electrical currents.

13. The imager of claim 12, wherein the bias point is constructed and arranged to selectively substantially shut off the first electrical output of the first detector element.

14. The imager of claim 1, wherein the imager provides an electrical output that can be addressably sensed and contributes to a collective output of a pixel array.

15. The imager of claim 14, wherein an image corresponding to the collective output of the pixel array can be captured or displayed.

16. The imager of claim 1, wherein the imager is incorporated into a portable light sensing device.

17. The imager of claim 3, further comprising a read buffer configured to allow varying integration times without losing a collected charge from the collection point.

18. The imager of claim 1, further comprising an output point for providing an electrical output of the light-sensing imager, the output point having an output voltage corresponding to an integrated charge on a single collection point.

19. A light-sensing imager for detecting at least a portion of the electromagnetic spectrum, comprising:
 a first detector element having a micro-structured surface for detecting an infrared range of the electromagnetic spectrum, wherein the first detector element creates a first current;
 a second detector element for detecting a visible range of wavelengths of the electromagnetic spectrum, wherein the second detector element creates a second current and the first and second detector elements are formed monolithically on a common silicon substrate;
 a single collection capacitor constructed and arranged to combine the first current and the second current to cause an integrated charge on the single collection capacitor;
 a bias point disposed between the first detector element and the second detector element, the bias point constructed and arranged to selectively apply a reverse bias voltage to selectively shut off the first detector element; and
 an output point for providing and electrical output of the light-sensing imager, the output point having an output voltage corresponding to the integrated charge on a single collection point.

* * * * *